United States Patent
Tsai et al.

(10) Patent No.: US 10,074,558 B1
(45) Date of Patent: Sep. 11, 2018

(54) FINFET STRUCTURE WITH CONTROLLED AIR GAPS

(71) Applicant: Taiwan Semiconductor Manufacturing Co., Ltd., Hsinchu (TW)

(72) Inventors: Wen-Che Tsai, Hsinchu (TW); Min-Yann Hsieh, Kaohsiung (TW); Hua-Feng Chen, Hsinchu (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,359

(22) Filed: Nov. 1, 2017

Related U.S. Application Data

(60) Provisional application No. 62/564,862, filed on Sep. 28, 2017.

(51) Int. Cl.

| | |
|---|---|
| *H01L 21/768* | (2006.01) |
| *H01L 23/532* | (2006.01) |
| *H01L 21/8234* | (2006.01) |
| *H01L 21/285* | (2006.01) |
| *H01L 21/311* | (2006.01) |
| *H01L 23/528* | (2006.01) |

(52) U.S. Cl.
CPC .... *H01L 21/7682* (2013.01); *H01L 21/28568* (2013.01); *H01L 21/31116* (2013.01); *H01L 21/76843* (2013.01); *H01L 21/76882* (2013.01); *H01L 21/823475* (2013.01); *H01L 21/823481* (2013.01); *H01L 23/528* (2013.01); *H01L 23/53209* (2013.01); *H01L 23/53295* (2013.01)

(58) Field of Classification Search
CPC ... H01L 21/76; H01L 21/768; H01L 21/7682; H01L 21/28568; H01L 21/3116; H01L 21/76843; H01L 21/76882; H01L 21/823475; H01L 21/823481; H01L 23/528; H01L 23/53209; H01L 23/53295
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,912,602 B2 * | 12/2014 | Hsu | H01L 29/785 257/347 |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |

(Continued)

*Primary Examiner* — Fazli Erdem
(74) *Attorney, Agent, or Firm* — Haynes and Boone, LLP

(57) ABSTRACT

The present disclosure provides a method that includes forming an isolation feature in a semiconductor substrate; forming a first fin and a second fin on the semiconductor substrate, wherein the first and second fins are laterally separated by the isolation feature; and forming an elongated contact feature landing on the first and second fins. The elongated contact feature is further embedded in the isolation feature, enclosing an air gap vertically between the contact feature and the isolation feature.

20 Claims, 16 Drawing Sheets

(56) References Cited

U.S. PATENT DOCUMENTS

| | | | |
|---|---|---|---|
| 9,577,036 B1* | 2/2017 | Chang | H01L 29/0653 |
| 9,768,118 B1* | 9/2017 | Li | H01L 23/5283 |
| 9,786,737 B2* | 10/2017 | Cheng | H01L 29/0649 |
| 9,831,346 B1* | 11/2017 | Zang | H01L 29/785 |
| 2016/0359012 A1* | 12/2016 | Yu | H01L 29/4991 |
| 2017/0053912 A1* | 2/2017 | Ching | H01L 21/02532 |
| 2017/0154968 A1* | 6/2017 | Park | H01L 29/41791 |
| 2017/0162650 A1* | 6/2017 | Cheng | H01L 29/0649 |
| 2017/0186683 A1* | 6/2017 | Lin | H01L 23/528 |
| 2017/0207126 A1* | 7/2017 | Ching | H01L 21/82343 |
| 2017/0317212 A1* | 11/2017 | Kim | H01L 29/7851 |
| 2017/0345938 A1* | 11/2017 | Liu | H01L 29/165 |

* cited by examiner

FINFET STRUCTURE WITH CONTROLLED AIR GAPS

This application claims priority to U.S. Provisional Patent Application Ser. No. 62/564,862, entitled "FinFET Structure with Controlled Air Gaps," and filed on Sep. 28, 2017, the entire disclosure of which is hereby incorporated by reference.

BACKGROUND

In semiconductor technology, various integrated circuit features (such as doped regions and gate stacks) are formed on a substrate by various processes including photolithography process, ion implantation, etching and deposition. An interconnection structure (including various conductive features, such as contact features, via features and metal lines) is formed and configured to connect integrated circuit features into a functional circuit. For example, damascene processes may be utilized to form multilayer copper interconnections. However, the existing methods cause various issues, such as parasitic capacitance and bridging (leakage), which undesirably impacts the circuit performance, such as introducing additional time delay or cause the circuit malfunction. Especially, when the semiconductor technologies move forward to advanced technology nodes with smaller feature sizes, such as 20 nm, 16 nm or less, the parasitic capacitance issue is further deteriorated, which further leads to degradation of the circuit performance and reliability.

Therefore, the present disclosure provides an interconnection structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
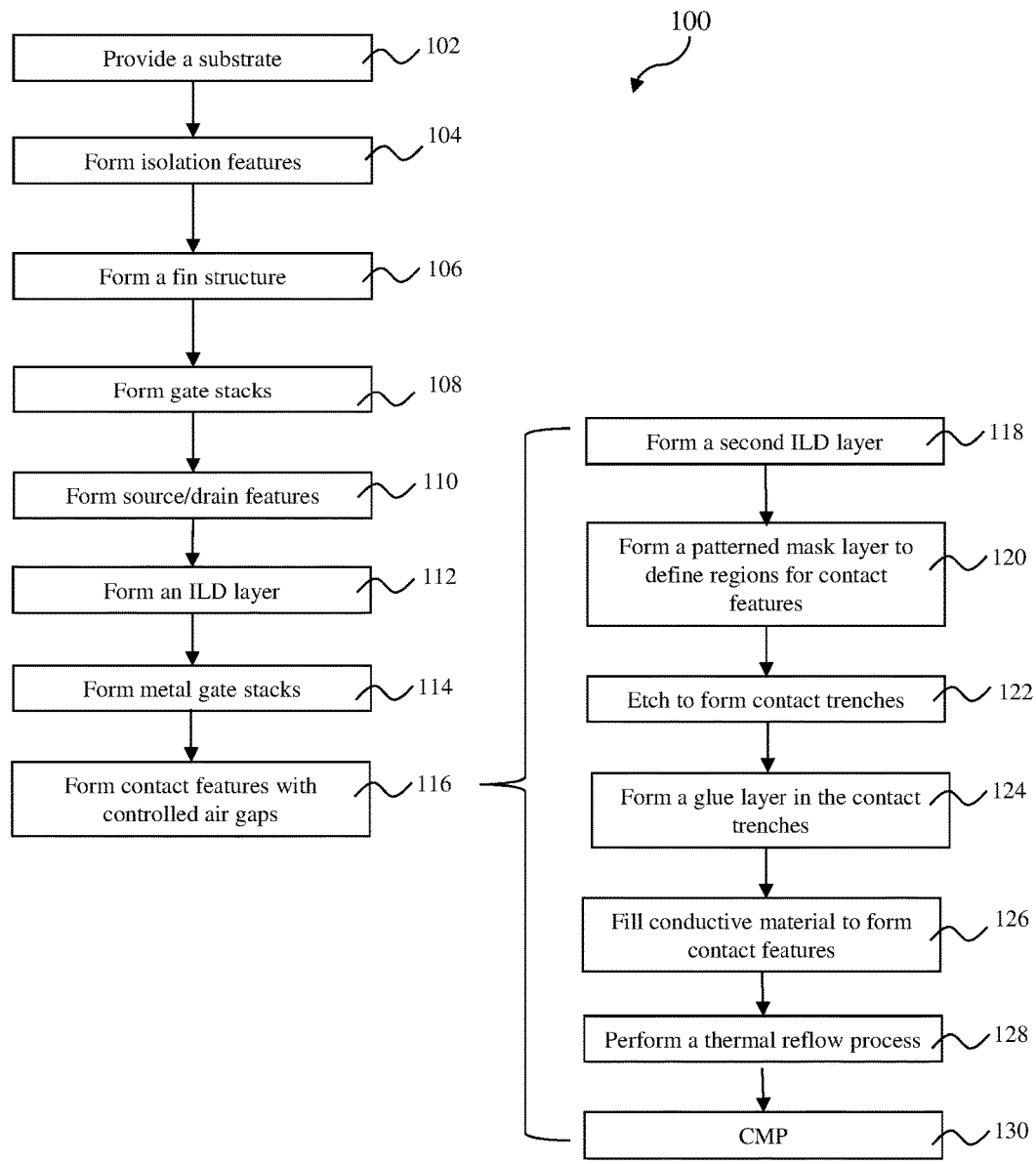
FIG. 1 is a flowchart of one embodiment of a method to form an integrated circuit (IC) structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor FinFET (or pFET) device and an N-type metal-oxide-semiconductor FinFET (or nFET) device. The following disclosure will continue with a FinFET example to illustrate various embodiments of the present invention. It is understood, however, that the application should not be limited to a particular type of device, except as specifically claimed.

FIG. 1 is a flowchart of a method 100 to form an integrated circuit in accordance with some embodiments. FIGS. 2A, 3A, 4A, 5A, 6A and 7A illustrate top views of an exemplary integrated circuit (IC) structure (or semiconductor structure) 200 during various fabrication stages constructed in accordance with some embodiments. FIGS. 2B, 3B, 4B, 5B, 6B, and 7B illustrate sectional views of the semiconductor structure 200 along dashed lines AA' during respective fabrication stages constructed in accordance with some embodiments. FIGS. 2C, 3C, 4C, 5C, 6C, and 7C illustrate sectional views of the semiconductor structure 200 along the dashed lines BB' during respective fabrication stages constructed in accordance with some embodiments. FIGS. 4D, 6D, and 7D illustrate sectional views of the semiconductor structure 200 along dashed lines AA' during respective fabrication stages constructed in accordance with some other embodiments. FIGS. 4E, 6E, and 7E illustrate sectional views of the semiconductor structure 200 along the dashed lines BB' during respective fabrication stages constructed in accordance with some other embodiments. With reference to FIGS. 1 through 7E, the method 100 and the exemplary semiconductor structure 200 are collectively described below.

Figure 2A:
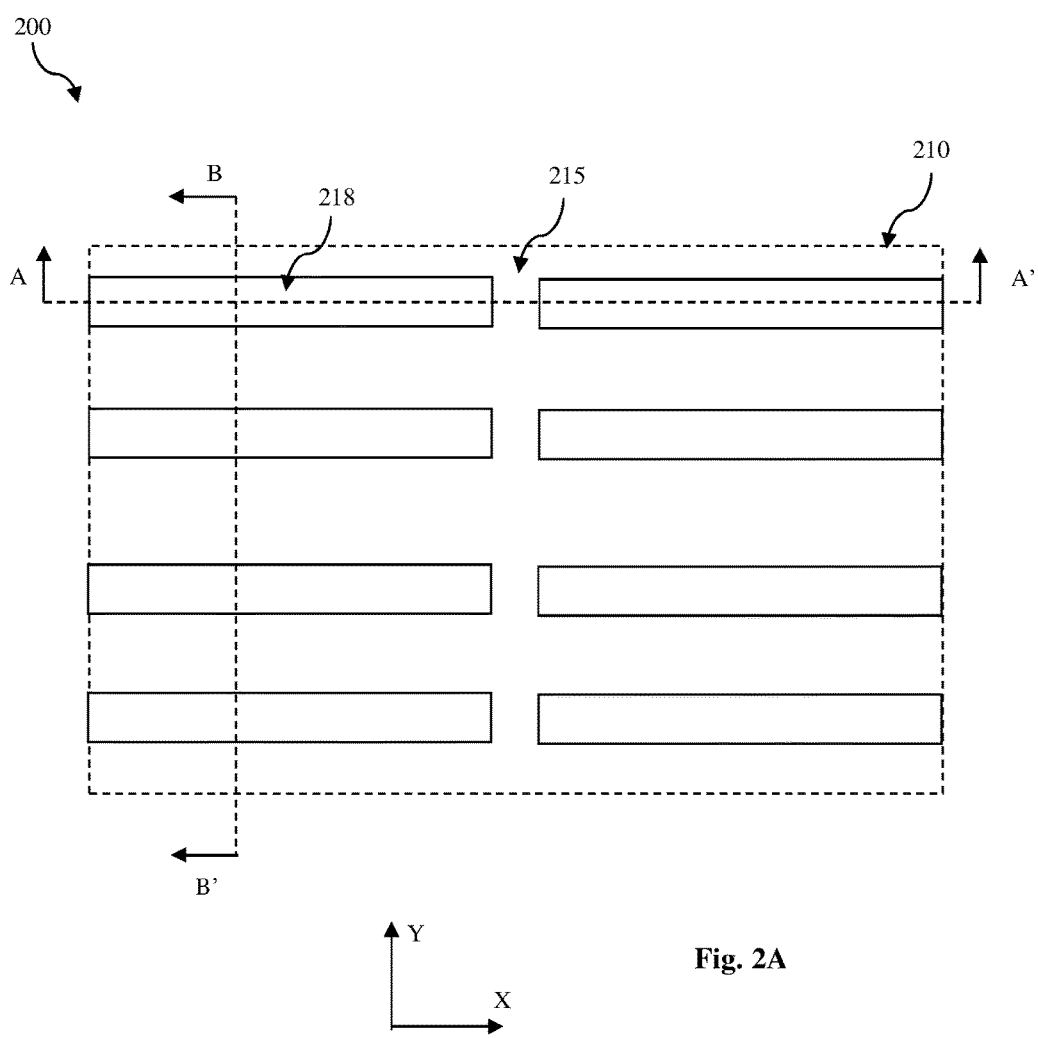
FIGS. 2A, 3A, 4A, 5A, 6A and 7A illustrate top views of an exemplary integrated circuit structure during various fabrication stages, made by the method of FIG. 1, constructed in accordance with some embodiments.
Figure 2B:
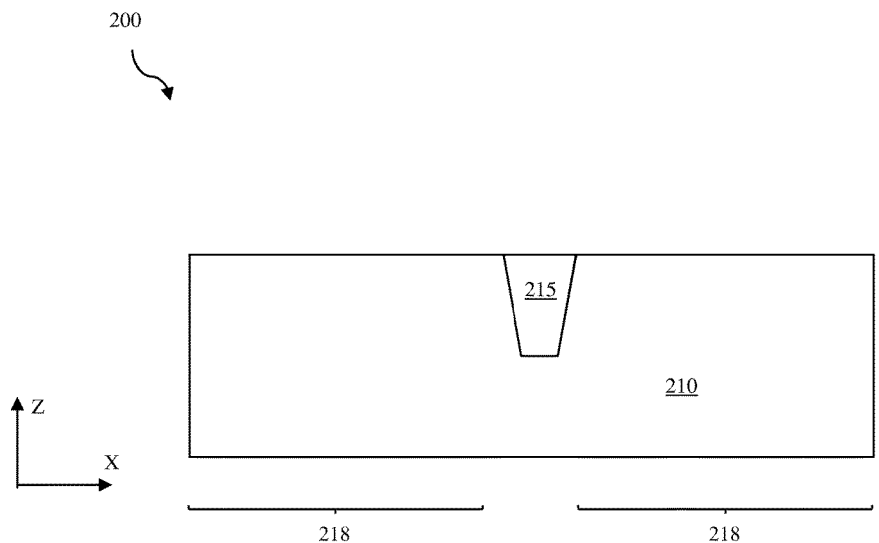
FIGS. 2B, 3B, 4B, 5B, 6B and 7B illustrate sectional views of the exemplary integrated circuit structure along dashed line AA' during respective fabrication stages constructed in accordance with some embodiments.
Figure 2C:
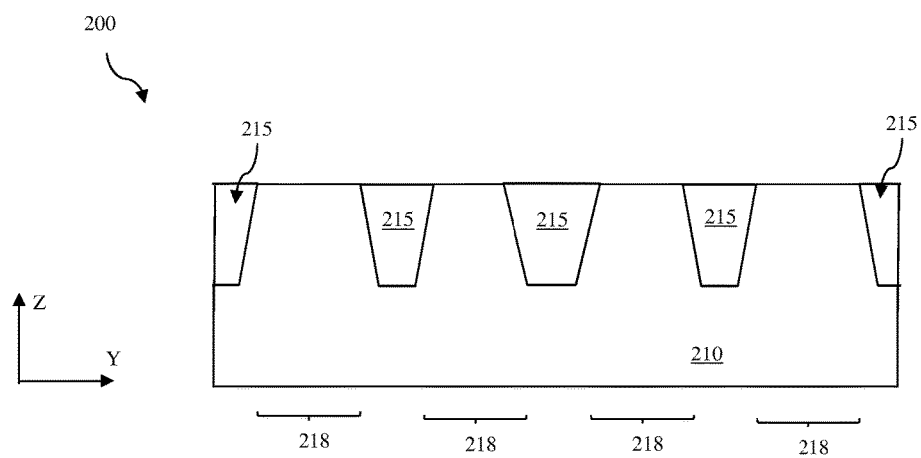
FIGS. 2C, 3C, 4C, 5C, 6C and 7C illustrate sectional views of the exemplary integrated circuit structure along dashed line BB' during respective fabrication stages constructed in accordance with some embodiments.

The method begins at block 102 by providing or receiving a substrate 210 as illustrated in FIGS. 2A, 2B and 2C. FIG. 2A is a top view of the semiconductor structure 200; FIG. 2B is a sectional view of the semiconductor structure 200 along the dashed line AA'; and FIG. 2C is a sectional view of the semiconductor structure 200 along the dashed line BB'. In some embodiments, the substrate 210 includes silicon. Alternatively, the substrate 210 may include other elementary semiconductor such as germanium in accordance with some embodiments. In some embodiments, the substrate 210 additionally or alternatively includes a compound semiconductor such as silicon carbide, gallium arsenic, indium arsenide, and indium phosphide. In some embodiments, the substrate 210 includes an alloy semiconductor such as silicon germanium, silicon germanium carbide, gallium arsenic phosphide, and gallium indium phosphide.

The substrate 210 may be uniform in composition or may include various layers. The layers may have similar or different compositions, and in various embodiments, some substrate layers have non-uniform compositions to induce device strain and thereby tune device performance. The substrate 210 may include an epitaxial layer formed on the top surface, such as an epitaxial semiconductor layer overlying a bulk semiconductor wafer. In various embodiments, the substrate 210 includes one or more epitaxially grown semiconductor material. For example, a silicon layer is epitaxially grown on a silicon wafer. In another example, a silicon germanium layer is epitaxially grown on a silicon wafer. In yet another example, silicon and silicon germanium are alternatively epitaxially grown on a silicon wafer. In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

Examples of layered substrates include silicon-on-insulator (SOI) substrates 210. For example, the substrate may include a buried oxide (BOX) layer formed by a process such as separation by implanted oxygen (SIMOX). In some such examples, the substrate 210 may include an embedded insulating layer such as a silicon oxide, a silicon nitride, a silicon oxynitride, or other suitable insulating materials.

Still referring to FIGS. 1 and 2A-2C, the method 100 includes an operation 104 by forming one or more isolation feature 215 in the substrate 210. In the present embodiment, the isolation features 215 are shallow trench isolation (STI) features. The STI features 215 are formed by any suitable procedure including deposition, photolithography, and/or etching processes. In one embodiment, the STI features 215 are formed by a procedure including forming a first hard mask layer, applying an etch process to the substrate 210 through the openings of the first hard mask layer to form trenches in the substrate 210, filling in the trenches with one or more dielectric material, and performing a chemical mechanical polishing (CMP) process to remove excessive dielectric material and planarize the top surface, thereby forming the STI features 215 and defining active regions 218. The isolation features 215 are formed on the substrate 210 in a figuration to isolate various active regions 218. The isolation features 215 include silicon oxide, silicon nitride, silicon oxynitride, low-k dielectric material, other suitable dielectric materials, or combinations thereof.

In various examples, the hard mask layer may be formed by depositing a material layer (such as silicon nitride), forming a patterned photoresist (resist) layer by a lithography process, and etching the material layer through the openings of the patterned photoresist layer to form the patterned hard mask layer. The CMP process may additionally remove the hard mask layer as well. Alternatively, the hard mask layer may be removed by an etch process, such as wet etch, after the CMP process. An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In another embodiment, the patterned photoresist layer directly uses the patterned mask layer as an etch mask of the etch process to form the trenches in the substrate 210. In yet another embodiment, the patterned hard mask layer includes silicon oxide, silicon nitride, silicon oxynitride, or any other suitable dielectric material. The patterned hard mask layer may include a single material layer or multiple material layers. The hard mask layer may be formed by thermal oxidation, CVD, ALD, or any other appropriate method.

Figure 3A:
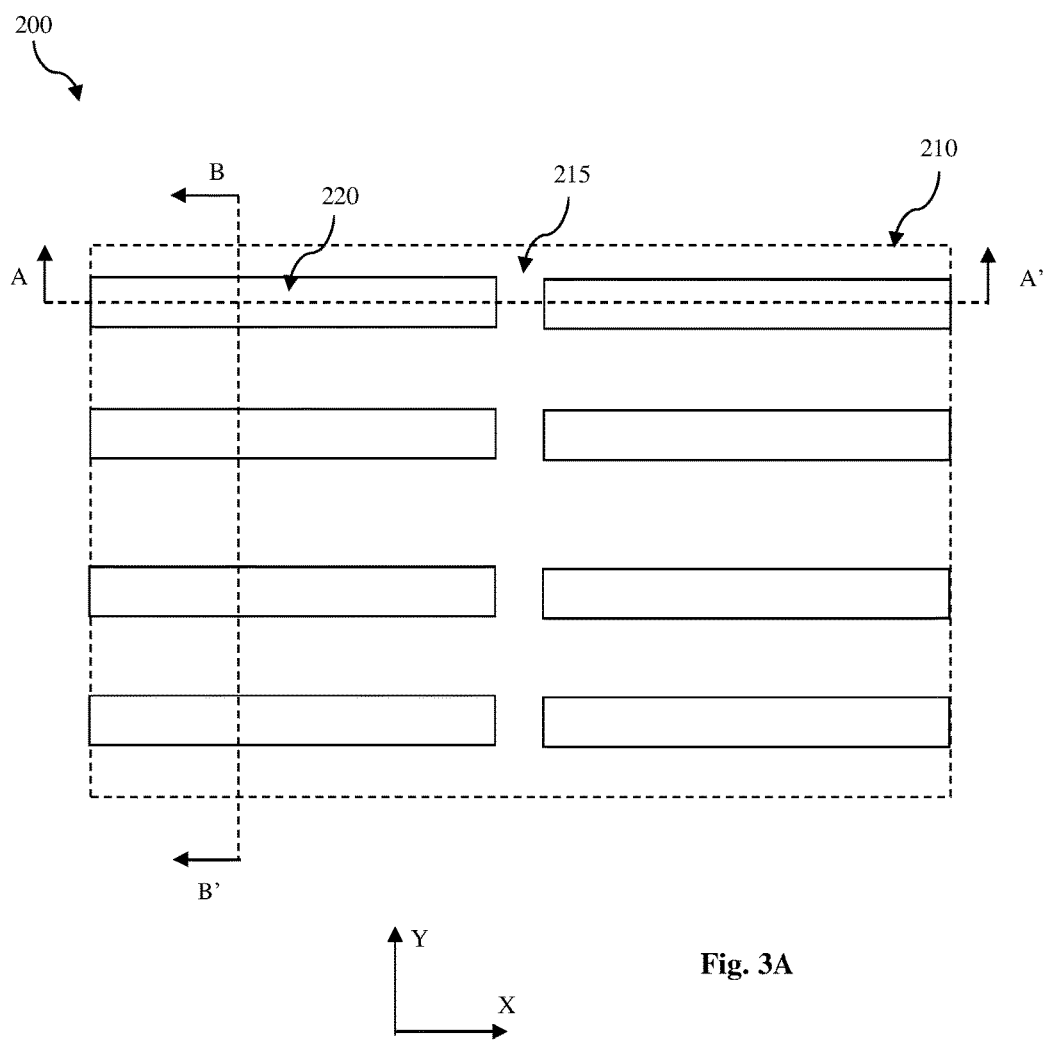
Figure 3B:
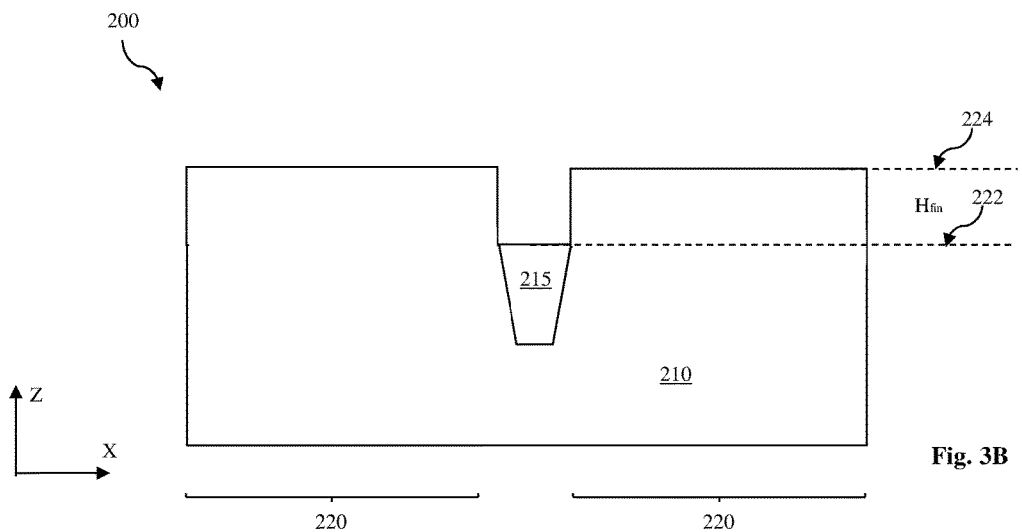
Figure 3C:
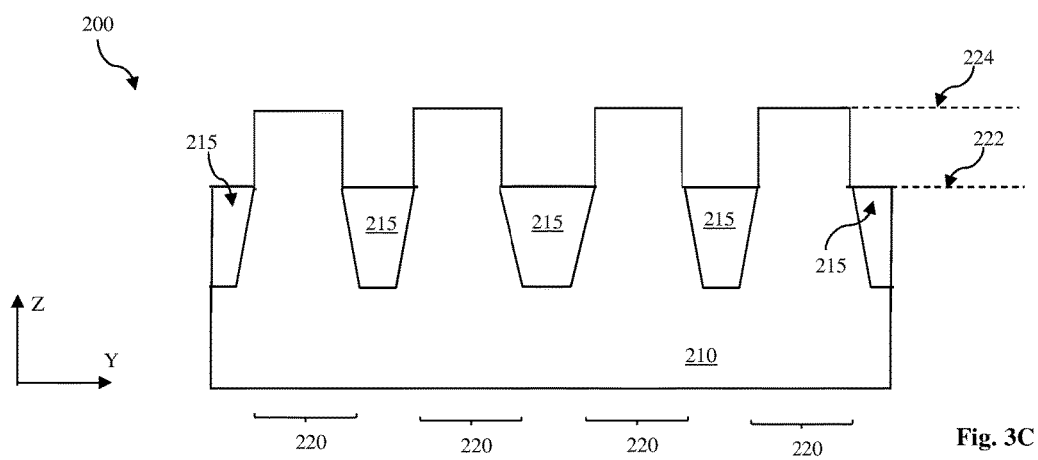

Referring to FIGS. 1 and 3A-3C, the method 100 includes an operation 106 by forming a fin structure to have one or more fin active regions (or simply fins) 220 on the substrate 210. FIG. 3A is a top view of the semiconductor structure 200; FIG. 3B is a sectional view of the semiconductor structure 200 along the dashed line AA'; and FIG. 3C is a sectional view of the semiconductor structure 200 along the dashed line BB'. The fins 220 are extended above the STI features 215 so that various devices, such as field-effect transistors (FETs), are formed on multiple surfaces of the fins 220 to achieve high coupling efficiency and device performance. As illustrated in FIGS. 3B and 3C, the STI features 215 includes a top surface 222 and the fins 220 include a top surface 224 being vertically higher than the top surface 222 by a dimension $H_{fin}$.

In some embodiments, the fins 220 are formed by recessing the STI features 215 using a suitable etching process. The STI features 215 are recessed by selective etching with etchant designed to selectively remove the material(s) of the STI features 215. Any suitable etching technique may be used to recess the STI features 215, including dry etching, wet etching, RIE, and/or other etching methods. In an exemplary embodiment, an anisotropic dry etching is used to selectively etch the STI features 215 without etching the semiconductor material of fins 218, with a proper etching gas, such as fluorine-containing or chlorine-containing gas. The height $H_{fin}$ of the fins 200 is determined by the etching depth of the etching process used to recess the STI features 215.

Alternatively or additionally, selective epitaxial growth may be used to selectively grow one or more semiconductor material on the active regions such that the active regions vertically extrude above the STI features 215, thereby forming fins 220. By selective epitaxial growth, silicon (Si) features, silicon germanium (SiGe) features, silicon carbide (SiC) features, and/or other suitable semiconductor features are grown in a crystalline state on the active regions. Suitable epitaxial growth processes include CVD deposition techniques (e.g., vapor-phase epitaxy (VPE) and/or ultra-high vacuum CVD (UHV-CVD), molecular beam epitaxy, and/or other suitable epitaxial growth techniques.

Figure 4A:
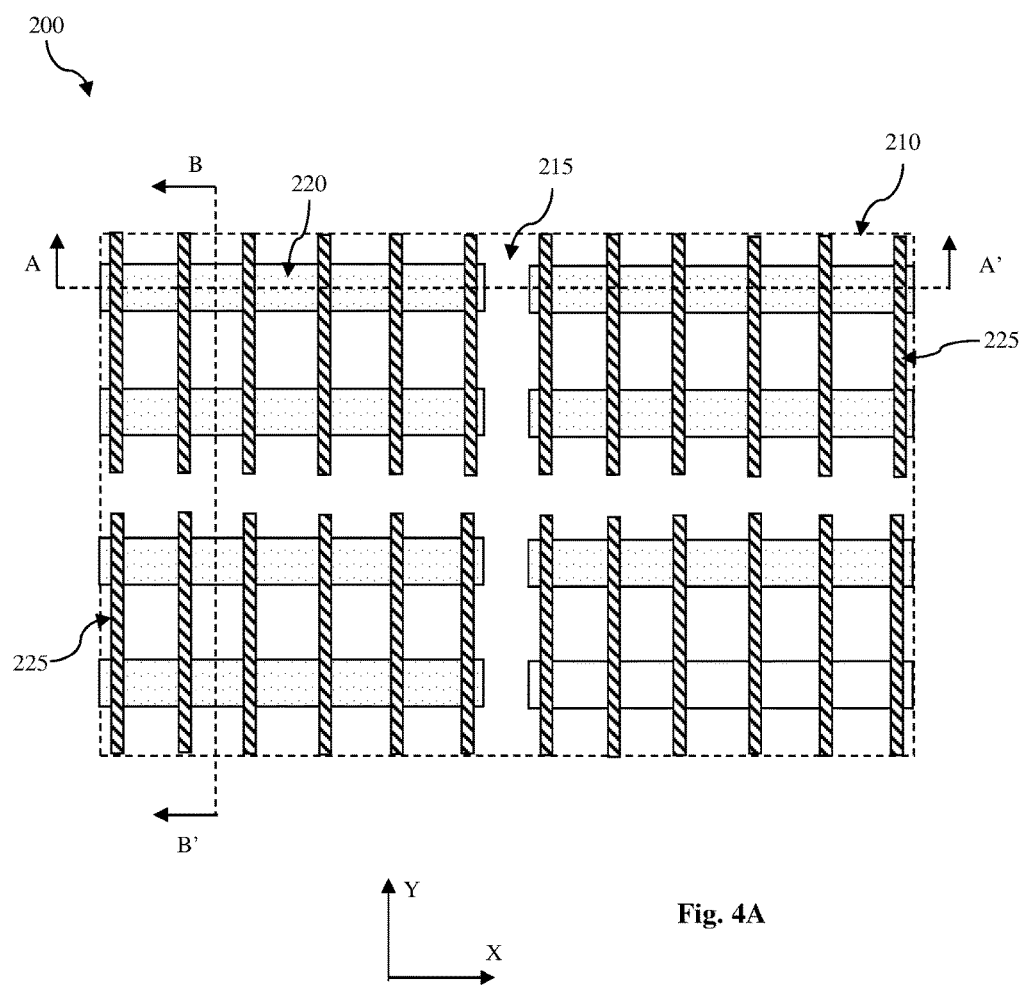
Figure 4B:
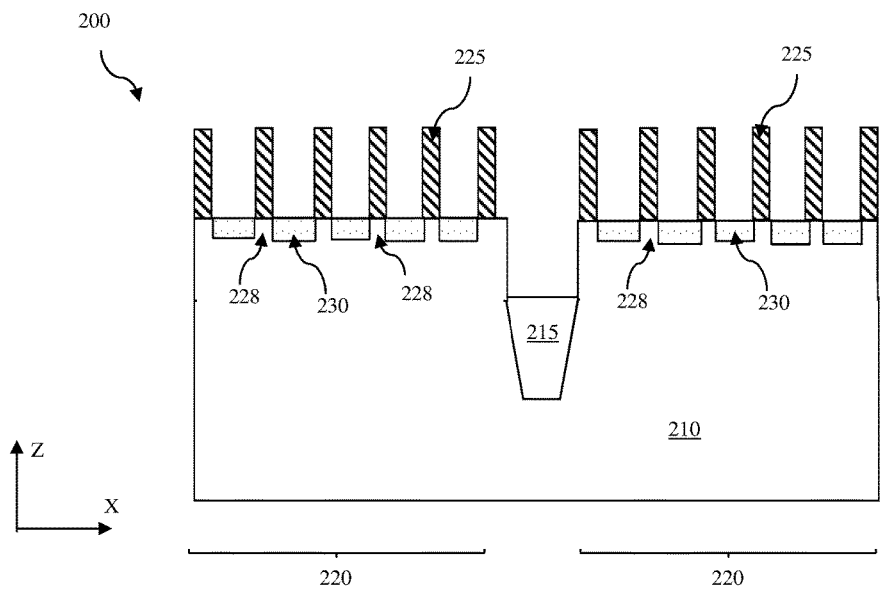
Figure 4C:
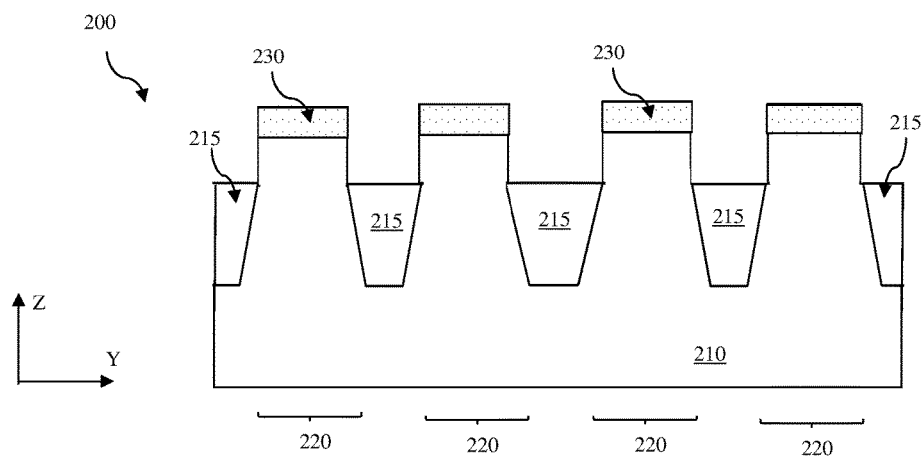
Figure 4D:
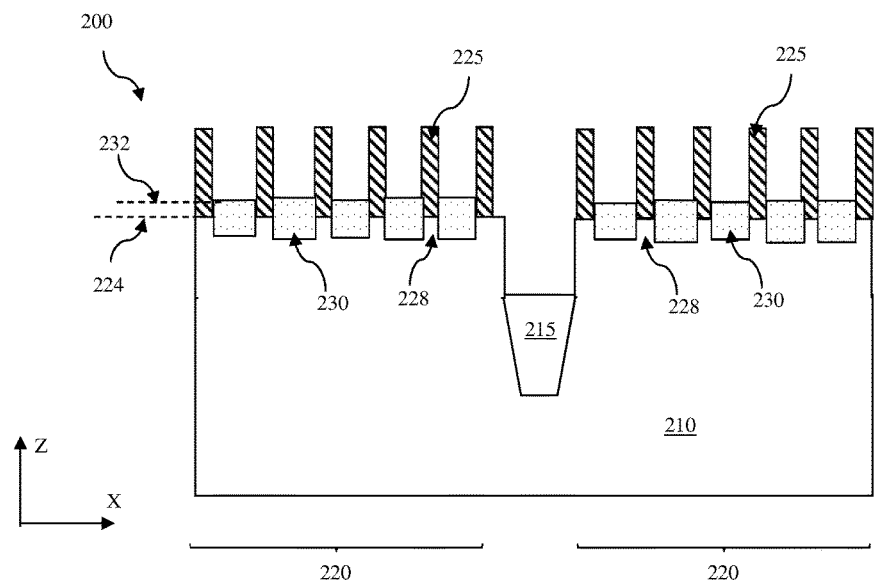
FIGS. 4D, 6D and 7D illustrate sectional views of the exemplary integrated circuit structure along dashed line AA' during respective fabrication stages constructed in accordance with other embodiments.
Figure 4E:
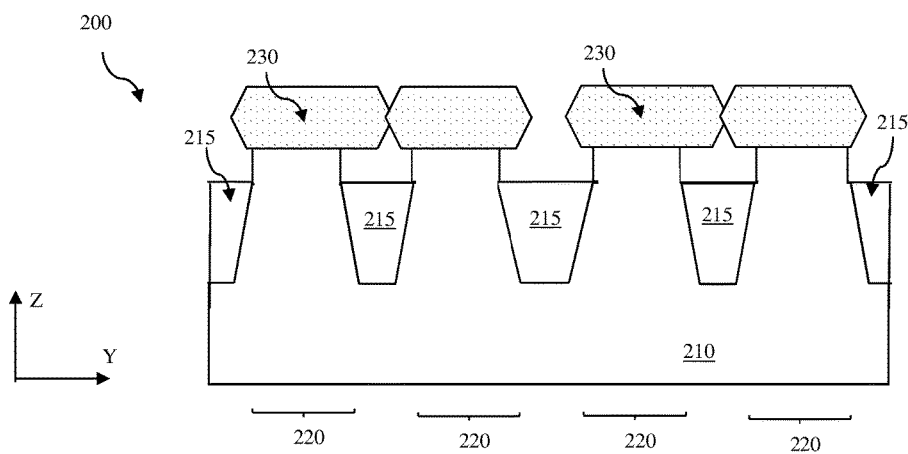
FIGS. 4E, 6E and 7E illustrate sectional views of the exemplary integrated circuit structure along dashed line BB' during respective fabrication stages constructed in accordance with other embodiments.

Referring to FIGS. 1 and 4A-4E, the method 100 includes an operation 108 by forming gate stacks 225 on the fins 220. FIG. 4A is a top view of the semiconductor structure 200; and FIGS. 4B and 4C are sectional views of the semiconductor structure 200 along the dashed lines AA' and BB', respectively, in accordance with some embodiments. FIGS. 4D and 4E are sectional views of the semiconductor structure 200 along the dashed lines AA and BB', respectively, in accordance with some alternative embodiments. The gate stacks 225 are formed on multiple surfaces of the fins 220 to achieve high capacitive coupling between gate stacks and respective channel regions 228 (portions of the fins underlying respective gate stacks) for enhanced device performance, such as reduced threshold voltage.

In the present embodiment, the gate stacks 225 will be replaced by metal gate stacks at later fabrication stage, therefore also be referred to as dummy gate stacks. The dummy gate stacks 225 are formed over the channel regions of the fins 220. In some examples, the formation of the dummy gate stacks 225 includes depositing a dummy gate layer containing polysilicon or other suitable material; and patterning the dummy gate layer to form dummy gate stacks. A gate hard mask layer may be formed on the dummy gate material layer and is used as an etch mask for patterning the dummy gate layer. The gate hard mask layer may include any suitable material, such as a silicon oxide, a silicon nitride, a silicon carbide, a silicon oxynitride, other suitable materials, or combinations thereof. In one embodiment, the gate hard mask includes dual mask films, such as silicon oxide and silicon nitride. In some examples, the patterning process includes forming a patterned resist layer by lithography process; etching the hard mask layer using the patterned resist layer as an etch mask; and etching the dummy gate layer to form the dummy gate stacks using the patterned hard mask layer as an etch mask.

In some embodiments, one or more gate sidewall feature (gate spacer) is formed on the sidewalls of the dummy gate stacks 225. The gate sidewall feature may be used to isolate the subsequently formed source/drain features from the gate stacks; or may be used to offset the source/drain features. The gate sidewall feature may include any suitable dielectric material, such as a semiconductor oxide, a semiconductor nitride, a semiconductor carbide, a semiconductor oxynitride, other suitable dielectric materials, and/or combinations thereof. In some embodiments, the gate sidewall feature may include multiple layers, such as a first layer of silicon oxide and a second layer of silicon nitride. In one example, the gate sidewall feature is formed by deposition and anisotropic etching, such as dry etching. In another example, the first layer of the gate sidewall feature is formed by ALD and the second layer of the gate sidewall feature is formed by deposition and anisotropic etching.

Still referring to FIGS. 1 and 4A-4E, the method 100 includes an operation 110 by forming source and drain (S/D) features 230 on the fins 220. In the present embodiment, the S/D features 230 are epitaxially grown semiconductor features within the source/drain regions, which are defined on the fins and interposed by channel regions 228. The epitaxial source/drain features 230 may be formed by selective epitaxial growth (SEG) for strain effect with enhanced carrier mobility and device performance. The gate stacks 225 (including gate spacer) constrain the SEG process such that the source/drain features 230 are self-aligned within the source/drain regions. In many embodiments, the source/drain features 230 are formed by one or more selective epitaxial growth (epitaxial process), whereby silicon (Si) features, silicon germanium (SiGe) features, silicon carbide (SiC) features, and/or other suitable semiconductor features are grown in a crystalline state on the fin structure within the source/drain regions. In an alternative embodiment, an etching process is first applied to recess portions of the fins 220 within the source/drain regions before the epitaxial growth. The etching process may also remove any dielectric material disposed on the source/drain regions, such as those formed during the formation of the gate sidewall features. Suitable epitaxial processes include CVD deposition techniques, molecular beam epitaxy, and/or other suitable processes.

The source/drain features 230 may be in-situ doped during the epitaxial process by introducing doping species including: p-type dopants, such as boron or $BF_2$; and n-type dopants, such as phosphorus or arsenic. If the source/drain features 230 are not in-situ doped, an implantation process (i.e., a junction implant process) is performed to introduce the corresponding dopants into the source/drain features 230. In an exemplary embodiment, the source/drain features 230 in an nFET include silicon doped with phosphorous (SiP) or silicon carbide doped with phosphorous (SiCP), while those in a pFET include silicon germanium doped with boron (SiGeB), SiGeSnB (tin may be used to tune the lattice constant) and/or GeSnB. The source/drain features 230 may include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the source/drain features 230. Suitable annealing processes include rapid thermal annealing (RTA), laser annealing processes, other suitable annealing technique or a combination thereof.

In some other embodiments, the source/drain features 230 may be epitaxially grown to a raised level such that the top surface 232 of the source/drain features 230 is vertically higher than the top surface of the fins 220, as illustrated in FIG. 4D. Those source/drain features 230 are referred to as raised source/drain features.

In some embodiments, the epitaxial grown source/drain features 230 on different fins 220 are separated from each other, as illustrated in FIG. 4C. Alternatively, the lateral epitaxial growth may cause epitaxial grown source/drain features 230 on adjacent fins 220 are merged together to form shared source/drain features 230, as illustrated in FIG. 4E.

Figure 5A:
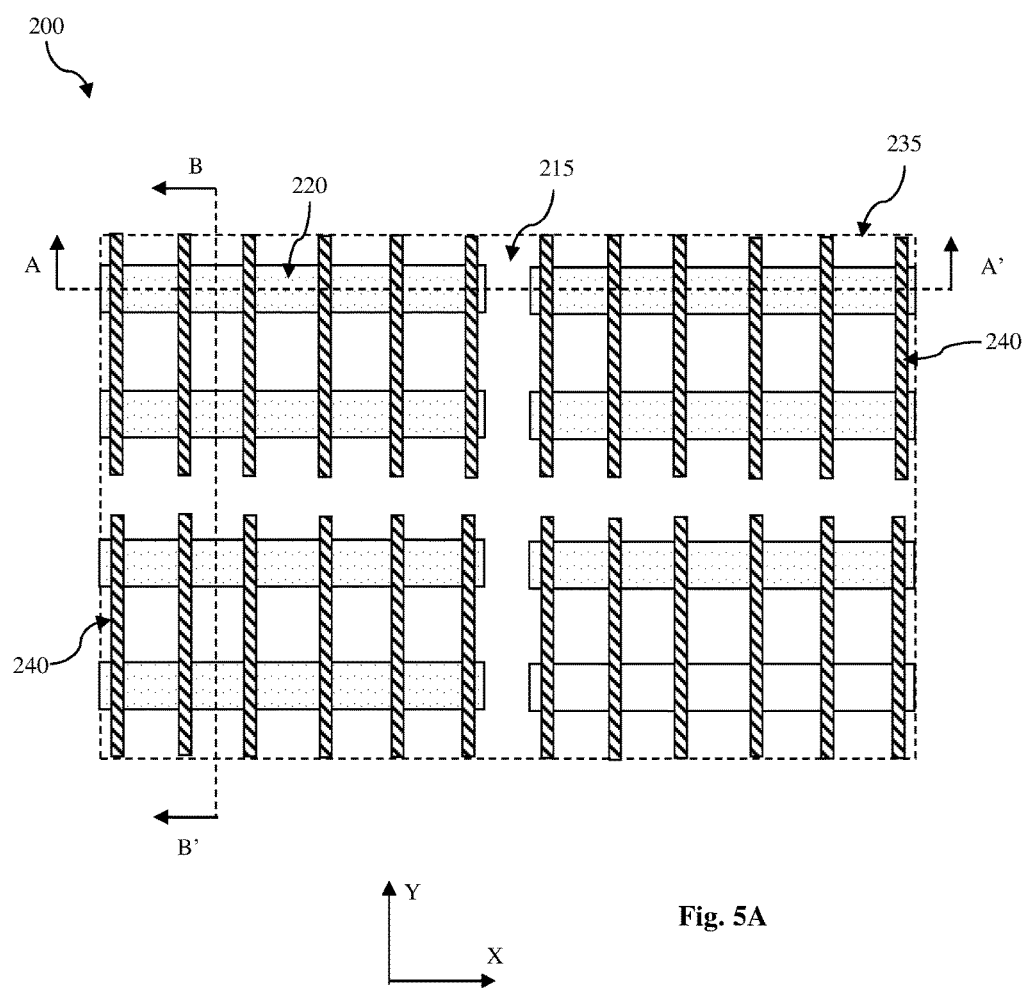
Figure 5B:
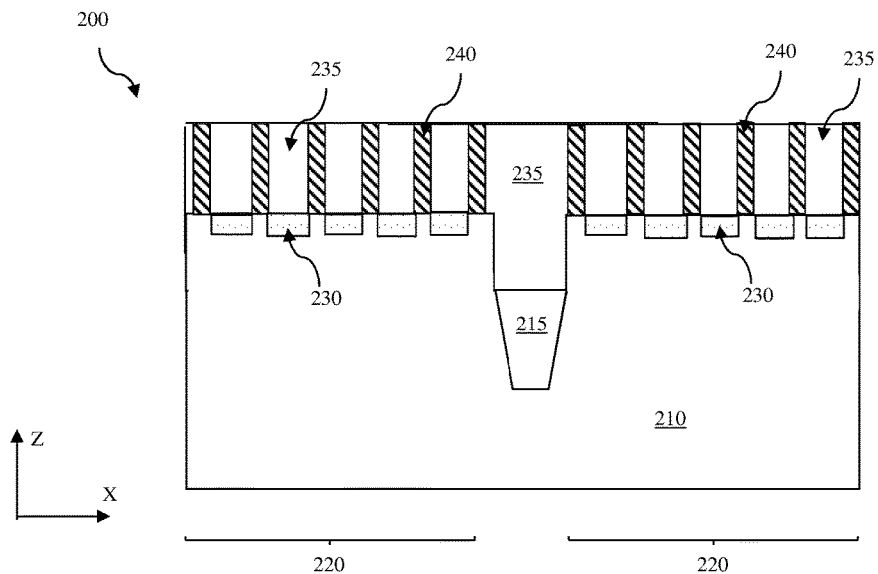
Figure 5C:
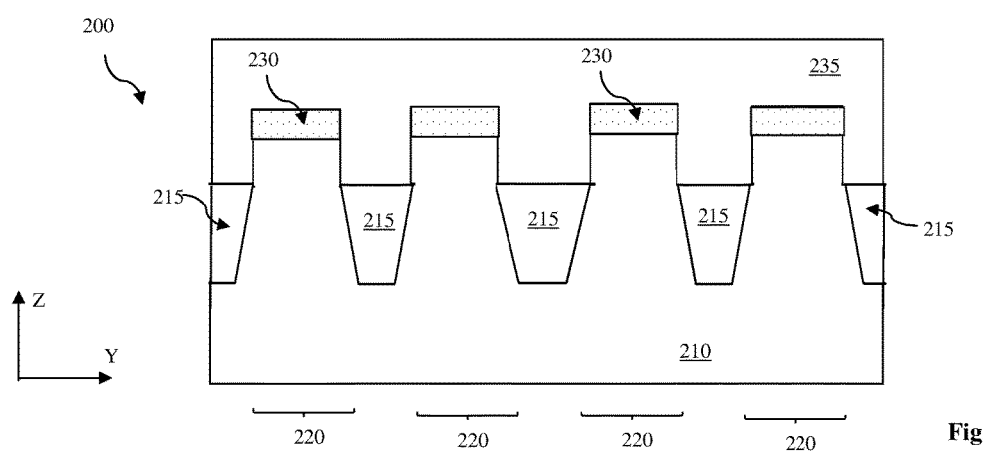

Referring to FIGS. 1 and 5A-5C, the method 100 includes an operation 112, in which an inter-level dielectric material (ILD) 235 is formed on the substrate to cover the source/drain features 230 in the source/drain regions. FIG. 5A is a top view of the semiconductor structure 200; FIG. 5B is a sectional view of the semiconductor structure 200 along the dashed line AA'; and FIG. 5C is a sectional view of the semiconductor structure 200 along the dashed line BB' in some embodiments. In the top view of the semiconductor structure 200 in FIG. 5A, the ILD layer 235 is drawn as transparent so that other features (such as the fins 200) can be illustrated. The ILD 235 acts as an insulator that supports and isolates conductive traces. The ILD 235 may include any suitable dielectric material, such as a silicon oxide, low-k dielectric material, porous dielectric material, other suitable dielectric material or a combination thereof. In an alternative embodiment, an etch stop layer may deposited on the substrate before the forming of the ILD 235 to provide etch stopping during the etching to form contacts in the ILD during later fabrication stages. The etch stop layer includes a material different from that of the ILD 235 to provide etch selectivity. For example, the etch stop layer may include silicon nitride deposited by CVD or ALD. In some embodiments, the formation of the ILD 235 includes deposition and CMP to provide a planarized top surface. The hard mask used to pattern gate stacks 225 may be removed during the CMP process, an additional etching operation, or a combination thereof.

Figure 6A:
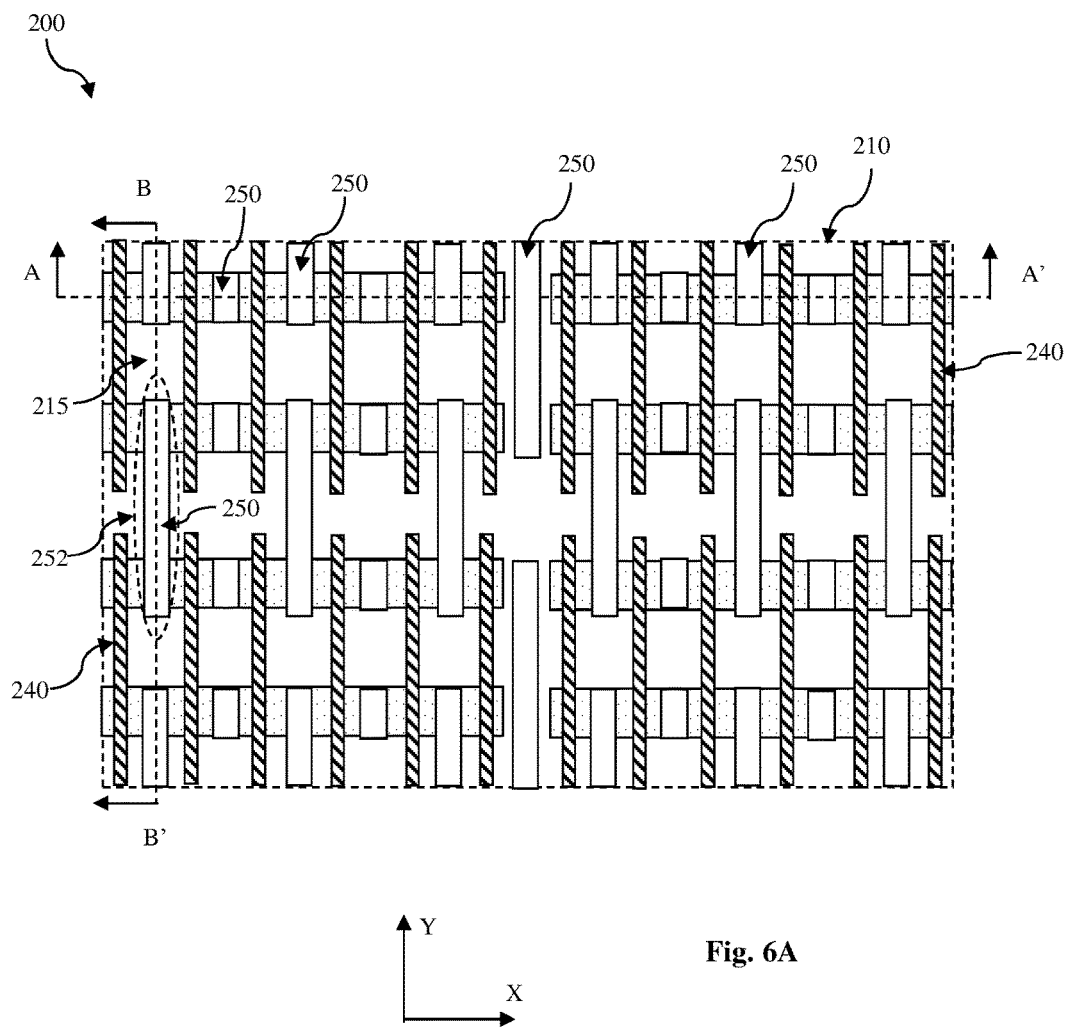
Figure 6B:
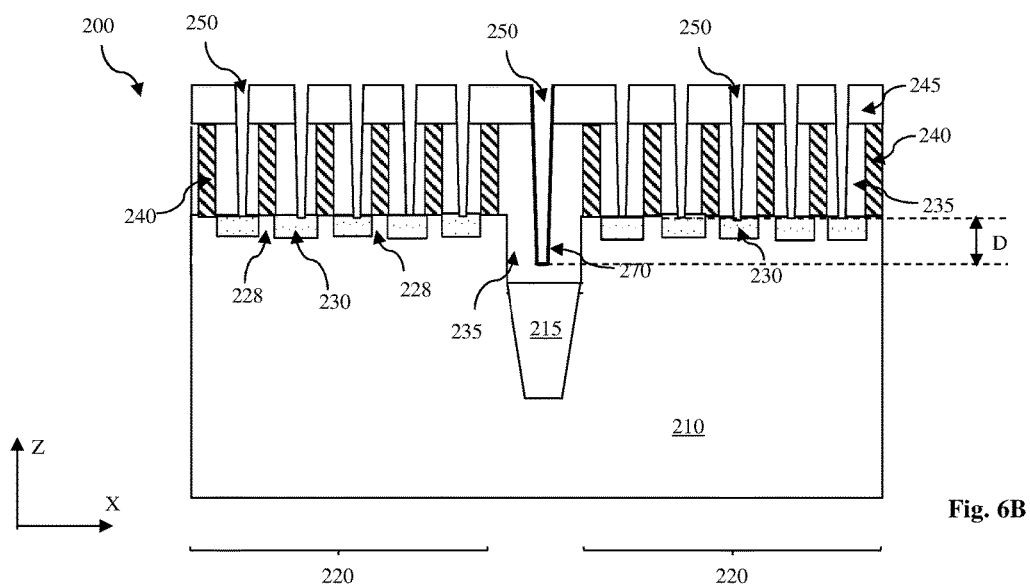
Figure 6C:
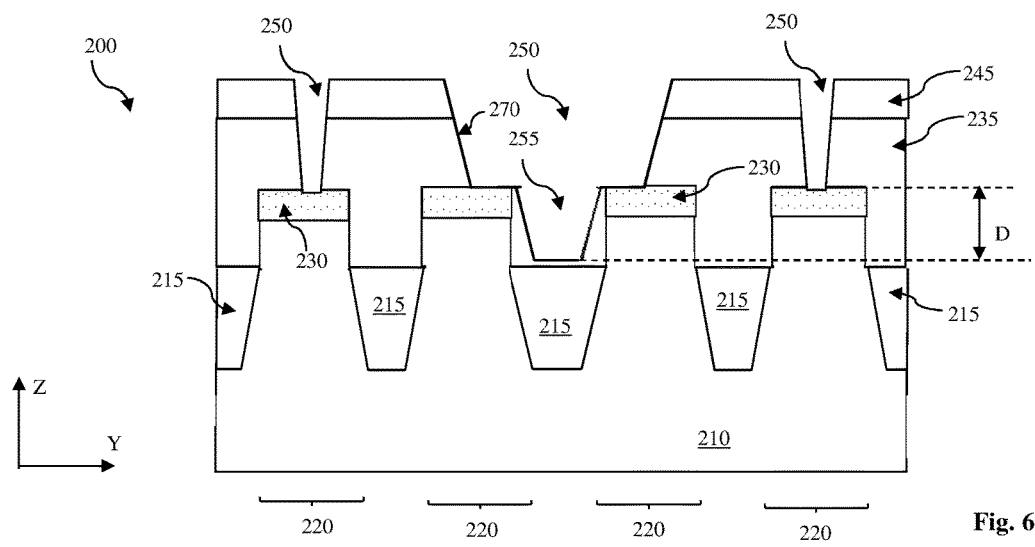
Figure 6D:
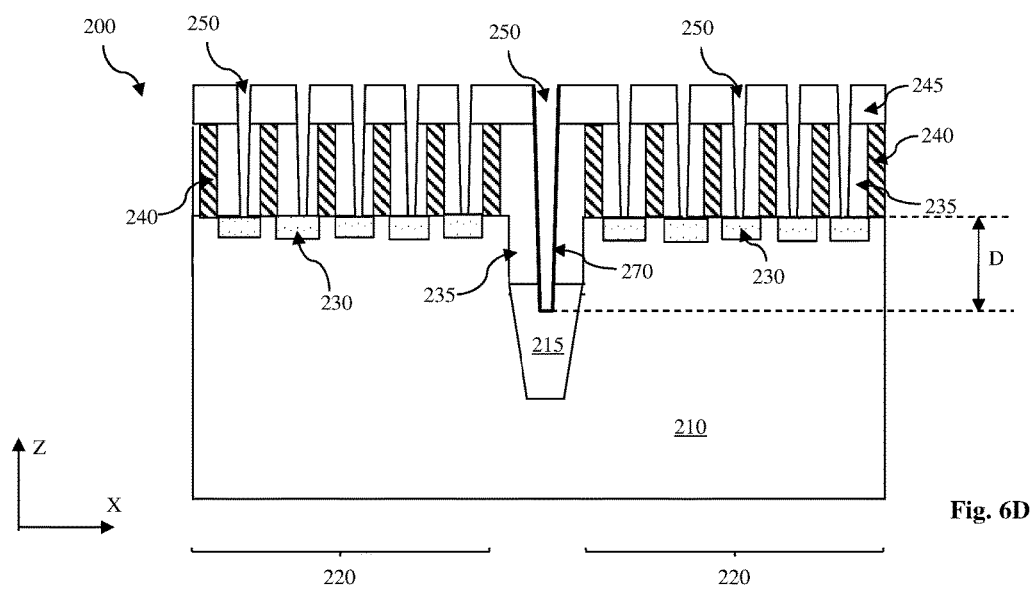
Figure 6E:
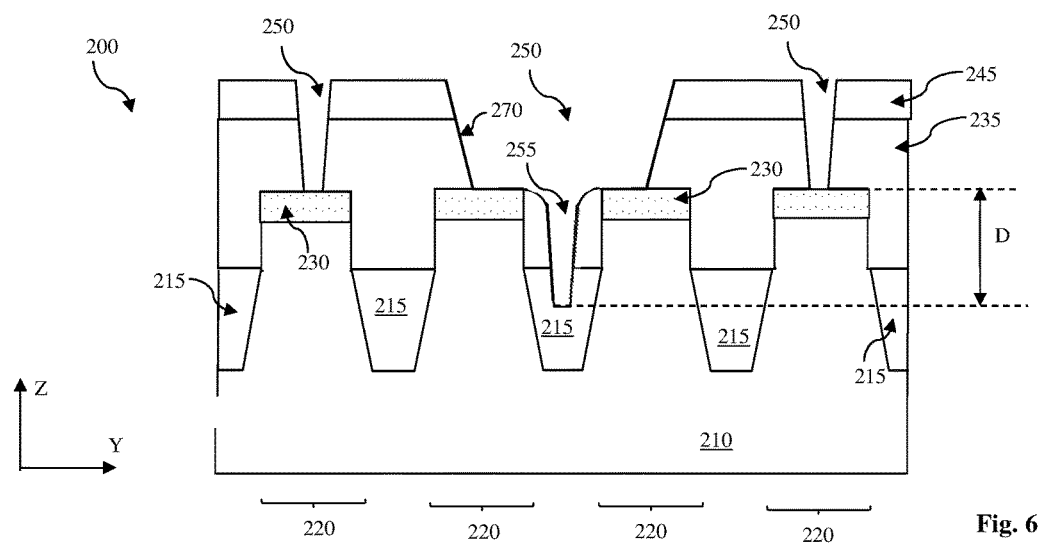

Referring to FIGS. 1 and 6A-6C, the method 100 includes an operation 114 by forming metal gate stacks 240 to replace the dummy gate stacks 225. FIG. 6A is a top view of the semiconductor structure 200; FIG. 6B is a sectional view of the semiconductor structure 200 along the dashed line AA'; and FIG. 6C is a sectional view of the semiconductor structure 200 along the dashed line BB' in some embodiments. The metal gate stacks 240, the source/drain features 230 and channel regions 228 are configured to form various FinFETs, such as nFinFETs and pFinFETs.

In the operation 114, the dummy gate stacks 225 are removed by suitable selective etching (such as wet etching), resulting in gate trenches. The etching process may include multiple etching steps to remove the dummy gate stacks if more materials present. After the removal of the dummy gate stacks 225, metal gate materials are deposited in the gate trenches, and a CMP process is applied to remove the excessive gate materials and planarize the top surface.

The gate materials of the metal gate stacks 240 include gate dielectric layer and gate electrode. In some embodiments, the gate dielectric layer includes a high-k dielectric material, and the gate electrode includes metal or metal alloy. The metal gate stacks 240 are formed on the semiconductor structure 200 wrapping around the channel regions 228 of the fins 220. In some examples, the gate dielectric layer and the gate electrode each may include a number of sub-layers. The high-k dielectric layer may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials.

The high-k dielectric layer is deposited a suitable technique, such as ALD, CVD, metal-organic CVD (MOCVD), PVD, thermal oxidation, and/or other suitable techniques. The gate dielectric layer may additionally include an interfacial layer disposed between the top surface of the fins and the high-k dielectric layer. The interfacial layer may include may include silicon oxide, silicon nitride, silicon oxynitride, and/or other suitable material, deposited by a suitable method, such as ALD, CVD, ozone oxidation, etc.

The gate electrode material is then filled in the gate trenches by a suitable technique, such as ALD, PVD, CVD, plating, other suitable process, or a combination thereof. The gate electrode may include a single layer or multiple layers, such as a metal layer, a liner layer, a wetting layer, and/or an adhesion layer. The gate electrode may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions, such as with a work function of 4.2 eV or less for nFET and a work function of 5.2 eV or greater for pFET. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD. In other examples, a barrier layer may be formed on deposited for lining the gate trenches before filling the metal. The barrier layer may include titanium, titanium nitride, tantalum, tantalum nitride or combination, deposited by suitable technique, such as PVD. In some examples, the gate dielectric layer includes the interfacial layer and the high-k dielectric layer. The gate electrode includes a capping layer, a metal layer to tune the work function, and a filling metal, such as aluminum, copper or tungsten.

Figure 7A:
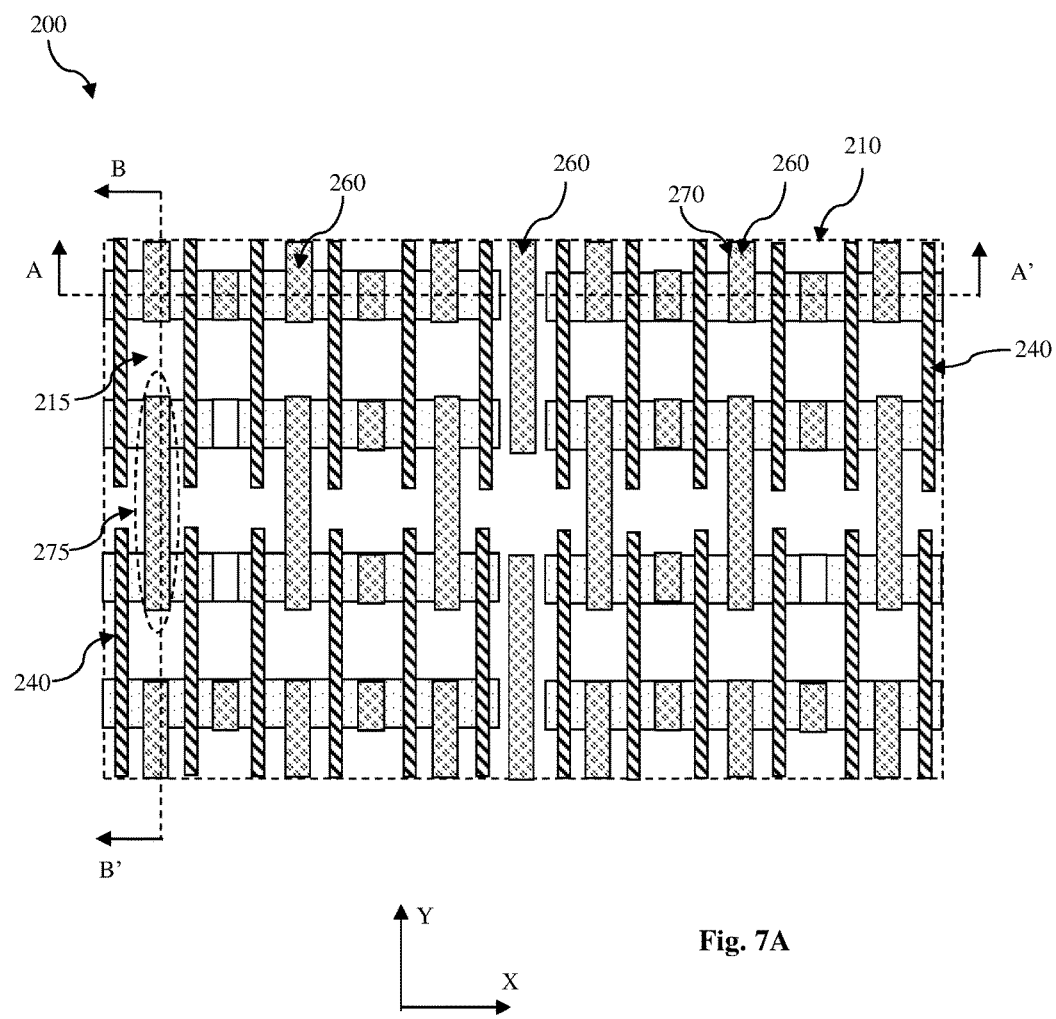
Figure 7B:
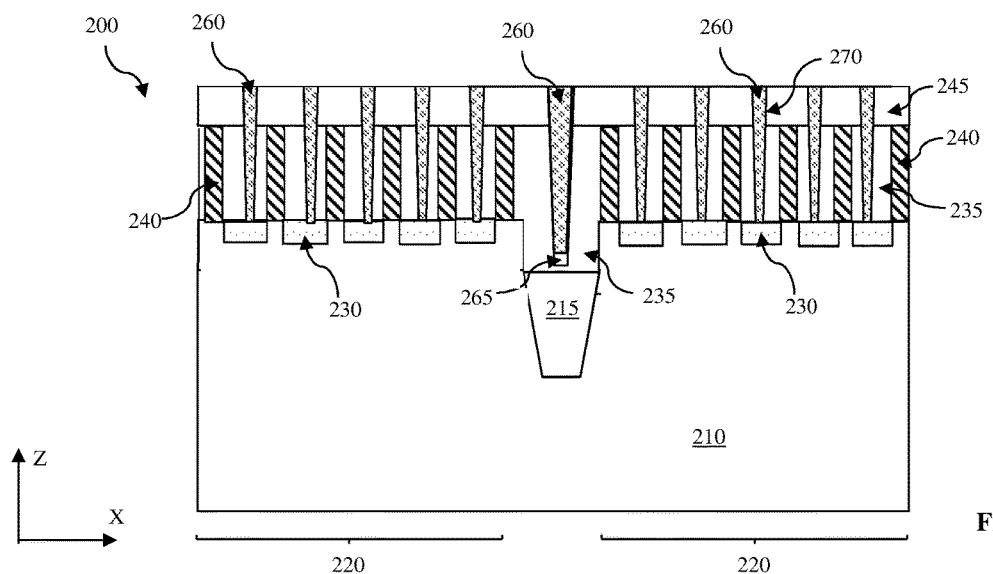
Figure 7C:
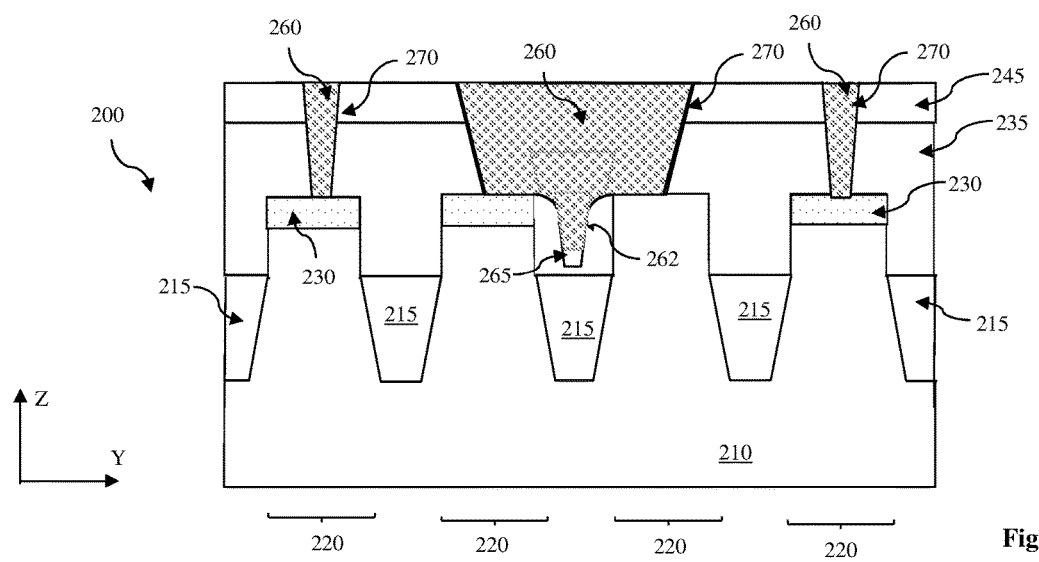
Figure 7D:
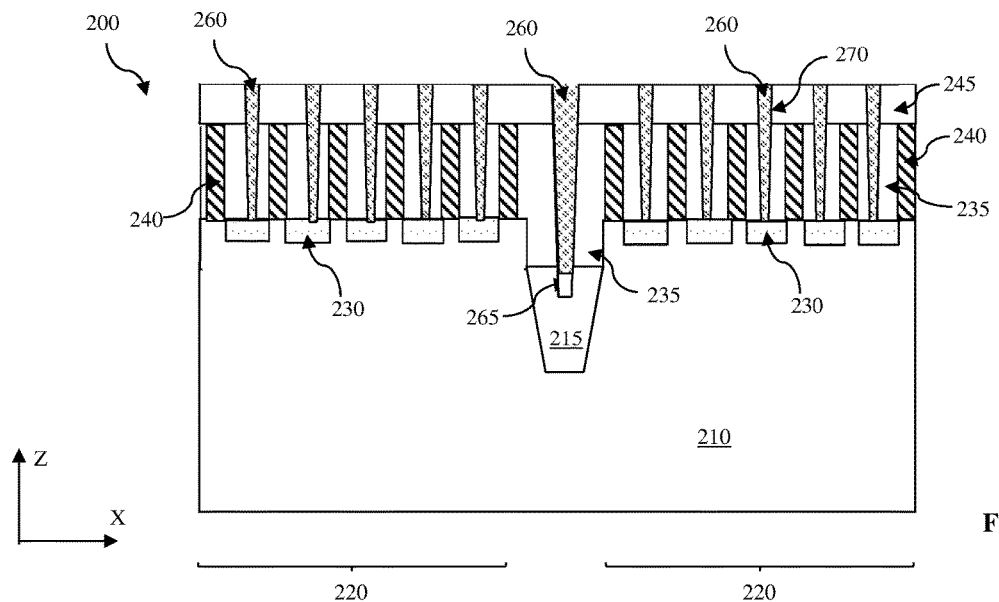
Figure 7E:
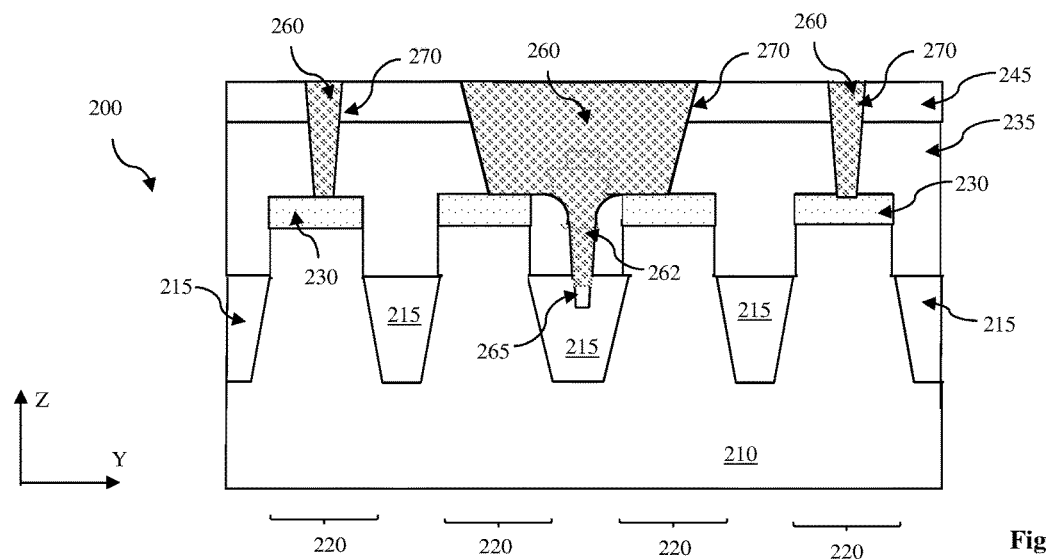

Referring to FIGS. 1, 6A-6E and 7A-7E, the method 100 includes an operation 116 by forming contact features 260. FIG. 7A is a top view of the semiconductor structure 200; and FIGS. 7B and 7C are sectional views of the semiconductor structure 200 along the dashed lines AA' and BB', respectively, in accordance with some embodiments. FIGS. 6D and 6E are sectional views of the semiconductor structure 200 of FIG. 6A at along the dashed lines AA' and BB', respectively, in accordance with some alternative embodiments. FIGS. 7D and 7E are sectional views of the semiconductor structure 200 of FIG. 7A along the dashed lines AA' and BB', respectively, in accordance with some alternative embodiments.

In the present embodiment, the operation 116 further includes multiple sub-operations: an operation 118 to form a second ILD layer 245; an operation 120 to form a patterned mask layer on the ILD layers (235 and 245) to define regions for the contact features 260; an operation 122 to etch the ILD layer to form contact trenches 250; an operation 124 to form a glue layer in the contact trenches; an operation 126 to fill in the contact trenches with a conductive material to form metal plugs; an operation 128 to perform a thermal reflow process at an elevated temperature to the conductive material; and an operation 130 to perform a CMP process to remove excessive conductive material and planarize the top surface of the semiconductor structure 200. Those operations are further described below in details.

In the operation 118 to form the second ILD layer 245, a dielectric material layer is deposited on the semiconductor structure 200. The dielectric material is similar to that used for the first ILD layer 235. For example, the ILD 245 may include any suitable dielectric material, such as a silicon oxide, low-k dielectric material, porous dielectric material, other suitable dielectric material or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SILK (Dow Chemical, Midland, Mich.), polyimide, porous polymer and/or other suitable materials as examples. In some embodiments, the formation of the ILD 245 includes deposition and CMP to provide a planarized top surface. The deposition of the dielectric material layer may utilize CVD, spin-on coating, or other suitable deposition technology.

In the operation 120, a patterned mask layer is formed on the second dielectric ILD layer 245 to define the regions for the contact features 260. In some embodiments where the mask layer is a resist layer, which is formed by a lithography process that includes spin-on coating, exposure and developing. In some alternative embodiments, the mask layer includes a hard mask material, such as silicon nitride, silicon oxide or silicon oxynitride. The formation of the patterned hard mask layer includes deposition and patterning. A mask material layer is first deposited and then is patterned by a lithography process and etching. The patterning process may further include forming a patterned resist layer on the hard mask using a lithography process; and etching the hard mask through the opening of the patterned resist layer using the patterned resist layer as an etch mask. After the formation of the patterned hard mask, the patterned resist layer may be removed by plasma ashing or wet stripping.

In the operation 122, an etching process is applied to selectively etch the ILD layers 235 and 245 using the patterned mask layer as an etch mask, thereby forming contact trenches 250 to expose the corresponding source/drain features 230. The etching process may include one or more etch steps, and may include any suitable etching technique, such as wet etch, dry etch or a combination thereof with proper etchant. For example, the etching process includes a dry etching to etch through the ILD layers 235 and 245. In some embodiments, the etching process to etch the ILD layers includes a plasma etching process using fluorine-containing etchant, such as $C_4F_6$, $O_2$ and $CH_2F_2$, and may further include a carry gas, such as argon.

The contact trenches 250 are aligned to and so to expose the corresponding source/drain features 230. Particularly, a contact trench 250 (e. g., the contact trench 250 in the dashed circle 252 of FIG. 6A) may have an elongated shape, such as rectangular shape to extend from one source/drain feature on one fin to another source/drain feature on an adjacent fin. In this case, the elongated contact trench 250 vertically aligns to both source/drain regions 230 and further extends over a portion of the isolation feature 215 between the both source/drain features. The etching process forms the contact trench not only exposing both the source/drain features but also the portion of the isolation feature between the source/drain features. The following description is focused on the elongate contact trench 250 in the dashed circle 252. The etching process is designed to selectively etch material of the ILD layers 235 and 245 with minimized damage to the source/drain feature 230. Since the ILD layers 235 and 245 have similar or same composition. The etching process will etch through the ILD layers 235 and 245 until it reaches the source/drain features 230. In other embodiments when an etch stop layer is present, the etching process further includes etching (such as wet etching to selectively etch the etch stop layer) to open the etch stop layer so that the corresponding source/drain features 230 are exposed within the contact trench 250. As the ILD layer 235 on the isolation feature 215 is much thicker and reaches below the isolation feature 215, which has the top surface 222 being lower than the top surface 224 of the fin 220, the etching process continue to etch to the lower portion of the ILD layer 235 overlying the isolation feature 215, thereby forming a trench tip 255, as illustrated in FIGS. 6B and 6C. The trench tip 255 has a smaller width and is vertically below the top surface 224 of the fin 220 with a depth D.

In alternative embodiments illustrated in FIGS. 6D and 6E, due to the similarity of the ILD layers and the isolation feature 215 in composition and less etch selectivity, the etching process can be controlled to continues etching into the isolation feature 215, resulting in the trench tip 255 penetrating to the isolation feature 215, as illustrated in FIGS. 6D and 6E. The trench tip 255 is at least partially surrounded by the isolation feature 215 with a depth D. By designing the compositions of the ILD layers (235 and 245) and the isolation features 215, etchant, and other etching parameters (such as plasma RF power and pressure), the depth D can be controlled to a proper range. For example, the etching process is controlled to be less directional, so less glue layer in the tip portions of the contact trenches. In some examples, the etching process has a pressure ranging between 10 mT and 50 mT; and has a RF power ranging between 100 and 1000 W. In another example, the etching process is designed to have less etching selectivity between the ILD layers (235 and 245) and the isolation features 215; the trench tip 255 can reach deeper into the isolation features 215 with increased depth D, therefore leading to enhanced air gaps through the subsequent operations.

In the operation 124, a glue layer 270 is formed in the sidewalls of the contact trenches 250. The glue layer 270 is deposited on the surfaces of the contact trenches for lining the trenches to improve the formation of the contact features, such enhancing the wettability, increasing the adhesion and preventing the diffusion. In various embodiments, the glue layer 270 includes titanium, titanium nitride, other suitable glue material or a combination thereof. For example, the glue layer 270 may include two films, such as titanium nitride and titanium. In the present example, the glue layer 270 includes titanium nitride. The glue layer 270 is deposited with a thickness enough to provide the expected functions (such as wettability, adhesion and/or diffusion prevention) without too thick to occupy too much spaces of the contact trenches. In some examples, the glue layer 270 has a thickness ranging between nm to 10 nm. The formation of the glue layer 270 may include ALD or CVD. In some embodiments, the deposition of the glue layer 270 includes an ALD method with precursor tetrakis-dimethylamino titanium (TDMAT) and $N_2/H_2$. In some embodiments, the deposition of the glue layer 270 includes an ALD method with precursor titanium tetrachloride and ammonia ($NH_3$). The formation of the glue layer 270 can be tuned to control the glue layer 270 and ultimately to control the air gap formation and the volume of the air gap. In some embodiments, the formation of the glue layer 270 includes a nitridation process to the glue layer to enhance the adhesion between the glue layer and the metal plug. The deposition of the glue layer 270 may include depositing at elevated temperature, such as a deposition temperature ranging between 200° C. and 500° C. In some examples, the nitridation process introduces nitrogen gas to treat the glue layer 270. The control and tuning of the air gap include reducing the nitridation process, such as decreasing the nitridation duration and/or reducing the nitrogen pressure. In some other examples, the control and tuning of the air gap include reducing the thickness of the glue layer and/or other processing parameters, such as deposition temperature and deposition pressure. In alternative embodiments, the glue layer 270 may be deposited by physical vapor deposition (PVD), such as by sputtering deposition using a titanium target under nitrogen environment.

In the operation 126, a conductive material, such as metal or metal alloy, is deposited to fill in the contact trenches 250, resulting in metal plugs as contact features 260. In the present embodiment, the metal plugs are cobalt plugs. Alternatively, the metal plugs may include cobalt, tungsten, copper, other suitable metal, metal alloy or a combination thereof. In one embodiment, for better filling effect, the formation of the contact features 260 includes alternatively depositing cobalt by PVD and CVD with multiple cycles until the contact trenches 250 are filled. In furtherance of the embodiment, the depositing of the cobalt plugs includes alternatively depositing cobalt by PVD and CVD at an elevated temperature. For a contact feature 260 (such as one in the dashed circle 275 of FIG. 7A) formed in the elongated contact trench 250, the contact feature 260 is extended to the trench tip 255, referred to as contact tip 262. The contact tip 262 is vertically below the source/drain features 230, as illustrated in FIGS. 7B and 7C. In some embodiments, the contact tip 262 further penetrates into the corresponding isolation feature 215, as illustrated in FIGS. 7D and 7E.

In the operation 128, after the deposition to form the metal plugs, a thermal reflow process is applied to the metal plugs to provide reflow and enhance the filling effect. In the present embodiment, the thermal reflow process includes a thermal annealing with a reflow temperature ranging between 300° C. and 500° C. In furtherance of the embodiment, the thermal reflow process includes introducing hydrogen gas so to perform the thermal reflow under hydrogen environment. To controlling and tuning the formation of the air gaps, the reflow temperature is decreased to a temperature below 400° C., such as 300° C. and 380° C.

After the thermal reflow process, the semiconductor structure 200 is cooled down to the environment temperature, such as room temperature. During and after the cooling down, an air gap 265. The air gap 265 is formed with the contact feature 260 that extends into the isolation feature 215, such as the contact feature 260 in the dashed circle 275 illustrated in FIG. 7A. The air gap 265 is underlying the contact feature 260, especially underlying the contact tip 262. The air gap 265 is surrounded by a dielectric material layer and capped by the contact tip 262. In some embodiments, the air gap 265 is formed in the ILD layer 235, as illustrated in FIGS. 7B and 7C. In some embodiments, the air gap 265 is formed in an isolation feature 215 and surrounded by the isolation feature 215, as illustrated in FIGS. 7D and 7E.

During the cooling down stage after the thermal reflow process, the deposited cobalt shrinks, resulting in the air gap 265 in the trench tip 255. Various factors impact the formation and volumes of the air gap 265, such as operations 122, 124 126 and 128. Those factors include, but not limited to, the the etching process to form contact trenches (including etching selectivity and etching directionality), the formation of the glue layer (including the glue layer deposition, the nitridation process, and the deposition of the conductive material to form the metal plugs); and the thermal reflow process (including reflow temperature). The proper controlling and tuning the above operations can effectively enhance the formation of the air gaps and the increase the volume of the air gaps, as described above in the respective operations. By forming the air gaps 265 with enough sizes (or volumes), the parasitic capacitance is effectively reduced and the circuit performance is enhanced.

In the operation 130, a CMP process is applied to remove excessive conductive material deposited on the ILD layer 245 and planarize the top surface of the semiconductor structure 200.

The method 100 may include additional operations before, during or after the operations described above. For example, other conductive features, such as metal lines and via feature in the interconnection structure, may be formed by proper method (such as damascene process) to connect the various devices (including FETs) to a functional circuit.

The present disclosure provides an IC structure and a method making the same. Particularly, the semiconductor structure includes FinFETs with controlled air gaps. The air gaps are surrounded by a dielectric material layer and capped by the contact tips. In some embodiments, the air gaps are extended into the isolation features and being surrounded by the corresponding STI features. The method includes etching to form contact trenches; the deposition of the glue layer, the nitridation process; deposition of the conductive material to form the metal plugs; and the thermal reflow process. The method also includes tuning and controlling the above processes to enhance the formation of the air gaps. Those tuning and control includes, but not limited to, the reflow temperature is decreased below 400° C.; the nitridation process is reduced; and the deposition of the glue layer is less directional. Various advantages may present in some embodiments of the disclosed method and semiconductor structure. For example, by forming the air gaps with enough sizes, the parasitic capacitance is effectively reduced and the circuit performance is enhanced.

Thus, the present disclosure provides a method of fabricating an integrated circuit in accordance with some embodiments. The method includes forming an isolation feature in a semiconductor substrate; forming a first fin and a second fin on the semiconductor substrate, wherein the first and second fins are laterally separated by the isolation feature; and forming an elongated contact feature landing on the first and second fins. The elongated contact feature is further embedded in the isolation feature, enclosing an air gap vertically between the elongated contact feature and the isolation feature.

The present disclosure also provides a method of fabricating an integrated circuit in accordance with some embodiments. The method includes forming an isolation feature in a semiconductor substrate; forming a first fin and a second fin on the semiconductor substrate, wherein the first and second fins are laterally separated by the isolation feature; depositing a dielectric material layer on the isolation feature and the first and second fins; performing an etching process to the dielectric material layer, thereby forming a contact trench in the dielectric material layer, wherein the etching process further recesses the isolation feature; and forming a contact feature in the contact trench, the contact feature being landing on the first and second fins. The contact feature is further embedded in the isolation feature with an air gap enclosed vertically between the contact feature and the isolation feature.

The present disclosure provides an integrated circuit structure in accordance with some embodiments. The integrated circuit structure includes a substrate; first and second fins formed on the substrate and laterally separated from each other by isolation features; and a contact feature landing on both the first and second fins and embedding into the isolation feature, defining an air gap vertically between the isolation feature and the contact feature, wherein the contact feature includes cobalt.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an integrated circuit, comprising:
   forming an isolation feature in a semiconductor substrate, the isolation feature formed of a dielectric material that physically contacts the semiconductor substrate;
   forming a first fin and a second fin on the semiconductor substrate, wherein the first and second fins are laterally separated by the isolation feature;
   forming an elongated contact feature between the first and second fins and extending into the isolation feature thereby enclosing an air gap vertically between the elongated contact feature and the isolation feature, the dielectric material of the isolation feature extending from the semiconductor substrate to the elongated contact feature.

2. The method of claim 1, wherein the forming of the isolation feature includes
   patterning the semiconductor substrate to form a trench;
   filling a dielectric material in the trench; and
   performing a chemical mechanical polishing process to the dielectric material.

3. The method of claim of claim 2, wherein the forming of the first and second fins includes selectively epitaxially growing a first semiconductor material on a second semiconductor material of the semiconductor substrate.

4. The method of claim 3, wherein the first semiconductor material is silicon germanium and the second semiconductor material is silicon.

5. The method of claim 1, wherein the forming of the elongated contact feature includes
depositing a dielectric material layer on the isolation feature and the first and second fins;
patterning the dielectric material layer to form a contact trench, wherein the first and second fins are exposed within the contact trench, wherein a portion of the isolation feature within the contact trench is recessed;
forming a glue layer on sidewalls of the contact trench; and
forming a metal plug in the contact trench, wherein the metal plug is surrounded by the glue layer.

6. The method of claim 5, wherein
the patterning of the dielectric material layer includes performing an etching process to the dielectric material layer;
the forming of the glue layer includes depositing the glue layer and performing a nitridation process to the glue layer; and
the forming of the metal plug includes depositing a metal layer and performing a thermal reflow process to the metal plug in hydrogen environment.

7. The method of claim 6, wherein
the depositing of the glue layer includes depositing titanium nitride; and
the depositing of the metal layer includes depositing cobalt.

8. The method of claim 7, wherein the depositing of the glue layer includes depositing titanium nitride at a deposition temperature ranging between 300° C. and 400° C.

9. The method of claim 7, wherein the depositing of the metal layer includes alternatively depositing cobalt by physical vapor deposition and chemical vapor deposition.

10. The method of claim 6, wherein the performing the etching process includes performing the etching process using an etchant including $C_4F_6$, $O_2$ and $CH_2F_2$.

11. The method of claim 6, wherein the forming of the elongated contact feature includes tuning at least a subset of the etching process, the nitridation process, and the thermal reflow process to increase a volume of the air gap for reduced parasitic capacitance.

12. The method of claim 11, wherein the tuning of at least the subset of the etching process, the nitridation process, and the thermal reflow process includes decreasing a reflow temperature of the thermal reflow process to be below 400° C.

13. The method of claim 11, wherein the tuning of at least the subset of the etching process, the nitridation process, and the thermal reflow process includes reducing the nitridation process by decreasing at least one of a nitridation duration and a nitrogen pressure of the nitridation process.

14. A method of fabricating an integrated circuit, comprising:
forming an isolation feature in a semiconductor substrate, the isolation feature formed of a dielectric material that physically contacts the semiconductor substrate;
forming a first fin and a second fin on the semiconductor substrate, wherein the first and second fins are laterally separated by the isolation feature;
depositing a dielectric material layer on the isolation feature and the first and second fins;
performing an etching process to the dielectric material layer, thereby forming a contact trench in the dielectric material layer, wherein the etching process further recesses the isolation feature; and
forming a contact feature in the contact trench such that the contact feature is embedded in the isolation feature with an air gap enclosed vertically between the contact feature and the isolation feature the dielectric material of the isolation feature extending from the semiconductor substrate to the elongated contact feature.

15. The method of claim 14, wherein
the performing of the etching process includes performing the etching process to the dielectric material layer through an opening of a patterned mask layer; and
the forming of the contact feature includes depositing a titanium nitride glue layer on sidewalls of the contact trench, and depositing cobalt in the contact trench to form a cobalt plug on the titanium nitride glue layer in the contact trench.

16. The method of claim 15, further comprising performing a nitridation process to the titanium nitride barrier layer and performing a reflow process to the cobalt plug with a reflow temperature less than 400° C.

17. The method of claim 16, wherein the forming of the contact feature includes tuning the nitridation process and the reflow process to increase a volume of the air gap for reduced parasitic capacitance.

18. The method of claim of claim 15, wherein the depositing of the metal layer includes alternatively depositing cobalt by physical vapor deposition and chemical vapor deposition.

19. An integrated circuit (IC) structure, comprising:
first and second fins formed on a semiconductor substrate and laterally separated from each other by an isolation feature, the isolation feature formed of a dielectric material that physically contacts the semiconductor substrate; and
a contact feature between the first and second fins and extending into the isolation feature thereby defining an air gap vertically between the isolation feature and the contact feature, wherein the contact feature includes cobalt, wherein the dielectric material of the isolation feature extending from the semiconductor substrate to the elongated contact feature.

20. The IC structure of claim 19, wherein
the contact feature includes:
a titanium nitride layer; and
a cobalt plug being surrounded by the titanium nitride layer.

* * * * *